United States Patent [19]
McAllister et al.

[11] Patent Number: 5,844,446
[45] Date of Patent: Dec. 1, 1998

[54] OSCILLATOR BASED TAMPERPROOF PRECISION TIMING CIRCUIT

[75] Inventors: Paul McAllister, Chandler; Timothy Beatty, Mesa, both of Ariz.

[73] Assignee: Intel Corporation, Santa Clara, Calif.

[21] Appl. No.: 724,624

[22] Filed: Sep. 30, 1996

[51] Int. Cl.[6] .............................. H03B 5/24; H03B 5/04; H03K 5/125

[52] U.S. Cl. ............................ 331/111; 331/74; 331/143; 331/175; 331/186; 327/48; 327/49

[58] Field of Search ................................... 331/74, 108 C, 331/108 D, 111, 143, 150, 175, 185, 186; 327/39, 47, 49, 48; 395/555, 557

[56] References Cited

U.S. PATENT DOCUMENTS

| | | | |
|---|---|---|---|
| 3,742,384 | 6/1973 | Breitzmann et al. | 331/143 X |
| 3,748,591 | 7/1973 | Visioli, Jr. et al. | 331/111 X |
| 3,911,374 | 10/1975 | Busse et al. | 531/143 X |
| 5,107,523 | 4/1992 | Heaney et al. | 327/44 X |
| 5,274,337 | 12/1993 | Young et al. | 327/40 X |
| 5,280,605 | 1/1994 | Young et al. | 395/550 |
| 5,508,664 | 4/1996 | Rizzo | 331/143 X |

*Primary Examiner*—David Mis
*Attorney, Agent, or Firm*—Blakely, Sokoloff, Taylor & Zafman

[57] ABSTRACT

An oscillator that has a substantially-constant voltage source configured such that it does not require the voltage source to be tuned to a particular voltage to oscillate a particular frequency. The oscillator has greater precision and reliability since the inputs of the comparator are periodically switched to reduce the effects of comparator bias and to equalize the voltage stresses on the inputs of the comparator. Greater precision is also achieved through the use of a discrete resistor and a discrete capacitor to define the frequency of the oscillator. The present invention provides an oscillator and method to generate a periodic signal that is tamperproof because the circuitry that defines the period is either integrated onto the integrated circuit or contained within the package containing the integrated circuit. The oscillator may be used as a frequency reference in a speed governor circuit and that speed governor may be included in an integrated circuit such that the speed governor disables a functional block of the integrated circuit when the clock frequency exceeds a frequency limit.

26 Claims, 4 Drawing Sheets

OSCILLATOR BASED TAMPERPROOF PRECISION TIMING CIRCUIT

BACKGROUND OF THE INVENTION

1. Field of the Invention

The field of the invention relates to the field of governing the speed at which a computer may run; more particularly, the present invention relates to disabling the operation of an integrated circuit when the input clock signal exceeds an upper limit.

2. Description of Related Art

In some computers systems, the need may arise to disable the computer when a clock signal exceeds an upper frequency limit. For instance, using a clock that is too fast may cause problems in a system, since some of the components in the system may not be able to operate at the higher frequency.

In the fabrication of microprocessors, it is common to find out that some of the microprocessors are able to operate at higher frequencies than others even though all are fabricated with the same process. Process variations affecting, for example, the thickness of oxides can cause some wafer runs to yield parts that operate at much higher frequencies than in other wafer runs. Some companies test the upper frequency performance of newly fabricated microprocessors and sort them into "frequency" bins. Consequently, some microprocessors when sold are graded (and marked) for higher frequencies than others. The microprocessor may not function properly for frequencies above its marked frequency, especially under stressful ambient conditions or marginal power supply potential.

Companies have found that parts marked with one frequency are sometimes re-marked after being sold by the manufacturer with higher frequencies, and then resold. These re-marked parts could end up in computer systems sold to operate at higher frequencies than the manufacturer intended. An innocent purchaser of such a computer could find that the computer operates well part of the time but fails at other times. The failures may be difficult to trace, and if traced to the microprocessor, reflect badly on the manufacturer.

At least one manufacturer has incorporated a speed governor in its microprocessors which cause the microprocessors to fail if the clocking signals applied to them are higher than the frequency on the original mark. When this is done, the microprocessor could never be used in higher frequency applications since it will never operate at the higher frequencies.

In U.S. Pat. No. 5,107,523, entitled "Processor Clock Governor", issued Apr. 21, 1992 and assigned to the assignee to the present invention, a circuit is described for disabling a microprocessor when a clock with an improper frequency is used. A problem with this circuit is that the manner in which the "kill" signal is generated is itself subject to process variations and hence may not be settable with the precision desired.

In U.S. Pat. Nos. 5,280,605 and 5,274,337, a clock speed limiter is disclosed and uses an integrated resistor as the basis for a timing reference. The resistance value is sensitive to temperature variation, which makes the timing reference variable with temperature. In other words, because the resistance value is sensitive to temperature variation, the cut-off frequency is not constant with temperature, making it difficult to set a reliable cut-off value without losing yield.

In U.S. Pat. Nos. 5,280,605 and 5,274,337, the clock speed limiter uses a comparator which compares a voltage ramp across a capacitor with a reference voltage to generate the timing reference signal. Due to process variations, comparators often have a built-in bias that results in the output switching when the voltage ramp is less or more than the reference voltage. This causes the frequency reference signal to be generated earlier than or later than the desired time. In addition, over time, the difference in voltage stresses between the comparator input receiving the voltage ramp and the comparator input receiving the voltage reference may lead to a drift in the bias of the comparator. This causes the timing of the frequency reference signal to change over extended periods of use. Because of the built-in bias and the bias drift, the cut-off frequency may vary in each manufactured device and change over time, making it difficult to set a reliable cut-off value without losing yield.

As will be disclosed, the present invention provides a circuit that is substantially independent of temperature and process variation and additionally provides other advantages.

SUMMARY OF THE INVENTION

The present invention includes an oscillator having a voltage reference for generating a first substantially-constant voltage, a circuit coupled to receive the first substantially-constant voltage and charge a capacitor, a circuit to produce a second substantially constant voltage, a comparator to compare the capacitor voltage to the second substantially-constant voltage and generate a first signal depending on the comparison and a circuit to discharge the capacitor in response to a second signal capable of being generated in response to the first signal.

DETAILED DESCRIPTION

An oscillator is described. Furthermore, a clock speed limiter (speed governor) using the oscillator is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

The present invention provides an oscillator circuit and method that employs a substantially-constant voltage source configured such that it does not require the substantially-constant voltage source to be tuned to a particular voltage in order for the oscillator to oscillate at a particular frequency. In one embodiment, the oscillator of the present invention has greater precision and reliability since the inputs of the comparator are periodically switched to reduce the effects of comparator bias and to equalize the voltage stresses on the inputs of the comparator. Greater precision is also achieved through the preferred use of a discrete resistor and a discrete capacitor to define the frequency of the oscillator. Furthermore, the oscillator of the present invention generates a periodic signal that is tamperproof because, in one embodiment, the circuitry that defines the period is either integrated onto the integrated circuit or contained within the package containing the integrated circuit.

In one embodiment, the oscillator is used as a frequency reference in a speed governor circuit that generates a signal which indicates whether a clock frequency exceeds a predetermined frequency. Preferably, the speed governor is implemented on an integrated circuit to prevent the integrated circuit from operating with a clock frequency above the predetermined frequency by disabling a portion of the integrated circuit when the clock frequency exceeds the predetermined frequency.

The oscillator employs a substantially-constant voltage source to generate two substantially-constant voltages. Preferably, a bandgap voltage reference is used to generate two substantially-constant voltages. By sourcing the bandgap reference voltage (the first substantially-constant voltage) to a temperature insensitive resistor, $R_x$, coupled to a temperature insensitive capacitor, $C_x$, a voltage ramp is obtained across the capacitor. A voltage reference (the second substantially-constant voltage) is generated as a predetermined fraction of the bandgap reference output using a voltage divider, for example. It will be apparent to one skilled in the art that other circuits, such as zener diodes, may be used to generate substantially-constant voltages.

The voltage ramp and voltage reference are input to a comparator which asserts a frequency reference signal when the voltage ramp exceeds the voltage reference. In response to the asserted frequency reference signal, a discharge signal is asserted to discharge the capacitor and subsequently deasserted after a predetermined number of clock cycles to restart the voltage ramp. When the voltage across the capacitor drops below the reference voltage, the frequency reference signal is deasserted. Using this configuration, a substantially-constant and slow oscillating signal (frequency reference) is obtained.

One advantage of this configuration is that the stability of the voltage supplied by the substantially-constant voltage source, not the voltage level itself, determines the period of the oscillator. The substantially-constant voltage can vary from one cycle to the next (due to noise) without substantially affecting the period of the timing reference as long as the voltage is substantially-constant over each individual cycle. Since the substantially-constant voltage source is not required to supply a particular voltage, special tuning to adjust the substantially-constant voltage source to produce a particular voltage is avoided. The time, T, for the voltage ramp to exceed the reference voltage is a function of the ratio of the two substantially-constant voltages as determined by voltage divider resistors $R_1$ and $R_2$.

Note that T is independent of the voltage of the substantially-constant voltage source as long as the substantially-constant voltages remain constant during the time for the voltage ramp to exceed the voltage reference, T.

In one embodiment, the voltage-divider fraction is two-thirds, the temperature insensitive resistor is 100 kilohms with 0.1% tolerance and the temperature insensitive capacitor is 220 picofarads with 1.00% tolerance. However, it will be apparent to one skilled in the art that resistances and capacitances with different values and tolerances may be used.

Preferably, the temperature insensitive resistor and temperature insensitive capacitor are discrete devices. Discrete resistors and capacitors tend to have greater precision and less sensitivity to temperature than integrated resistors and capacitors. Additionally, a discrete capacitor achieves the RC time constant that is desired without requiring a significant amount of area on the integrated circuit. The incremental area required for an integrated capacitor on a large silicon device such as a state-of-the-art microprocessor can be relatively expensive. Preferably, each discrete device is coupled to a pair of bond pads and contained within the package of the integrated circuit. Alternatively, these devices are integrated onto the integrated circuit according to well-known methods. By integrating the resistor and capacitor on the integrated circuit or incorporating the resistor and capacitor within the package, the ability to change the resistor and capacitor values is diminished making the oscillator more tamperproof.

In one embodiment, the oscillator comprises a circuit for periodically switching the polarity of the inputs of the comparator (i.e., the voltage previously driven to the positive input is now driven to the negative input and the voltage previously driven to the negative input is now driven to the positive input) and inverting the output of the comparator to generate the frequency reference signal independent of whether the inputs are switched. This has the advantage that any built-in bias of the comparator tends to be canceled and the stresses associated with the input voltages tend to be equalized across the two inputs if the timing reference is used for an equal number of cycles in each polarity during each period in which the duration is to be controlled. For example, if the trip point of the comparator is biased, the cycle generated in one polarity will be shorter than the ideal (non-biased) duration by approximately the amount of time the cycle generated in the other polarity is longer than the ideal so that the duration of the two cycles taken together will be closer to the ideal.

Furthermore, in one embodiment, an on-chip ROM contains several entries each having a predetermined value corresponding to a cutoff frequency. Entry selection is done by bondpad options. Alternatively, other methods of selecting and storing the predetermined values may be used.

In one embodiment of the speed governor, digital circuitry counts the number of clock cycles which occur during a measurement cycle that is defined by one or more periods of the oscillator. At the beginning of each measurement cycle, a predetermined value is loaded into a decrement counter having a sign bit for the decrement count. If the number of clock cycles exceeds the predetermined value plus one before the measurement cycle is completed, the decrement counter value becomes negative and the sign bit is asserted. The predetermined value plus one is indicative of the maximum clock frequency allowed (the cutoff frequency). If the sign bit of the decrement counter value is asserted before the end of a measurement cycle, a frequency violation has occurred. This embodiment avoids the use of comparison logic to compare the counter value with the predetermined value. A hysteresis counter is used to generate a disable signal when a frequency violation occurs in a certain number of sequential measurement cycles to reduce the likelihood that a disable signal will be asserted due to noise, for example. In another embodiment, the disable signal is asserted in response to a single frequency violation. When the disable signal is asserted, a functional block coupled to the speed governor is disabled according to well-known methods. It will be apparent to one skilled in the art that the functional block may comprise any number of analog or digital devices that affect the operation of a system that uses a clock. For example, the microcode read-only-memory (ROM) may be disabled to disrupt the operation of a microprocessor when the clock frequency limit is exceeded.

Figure 1:
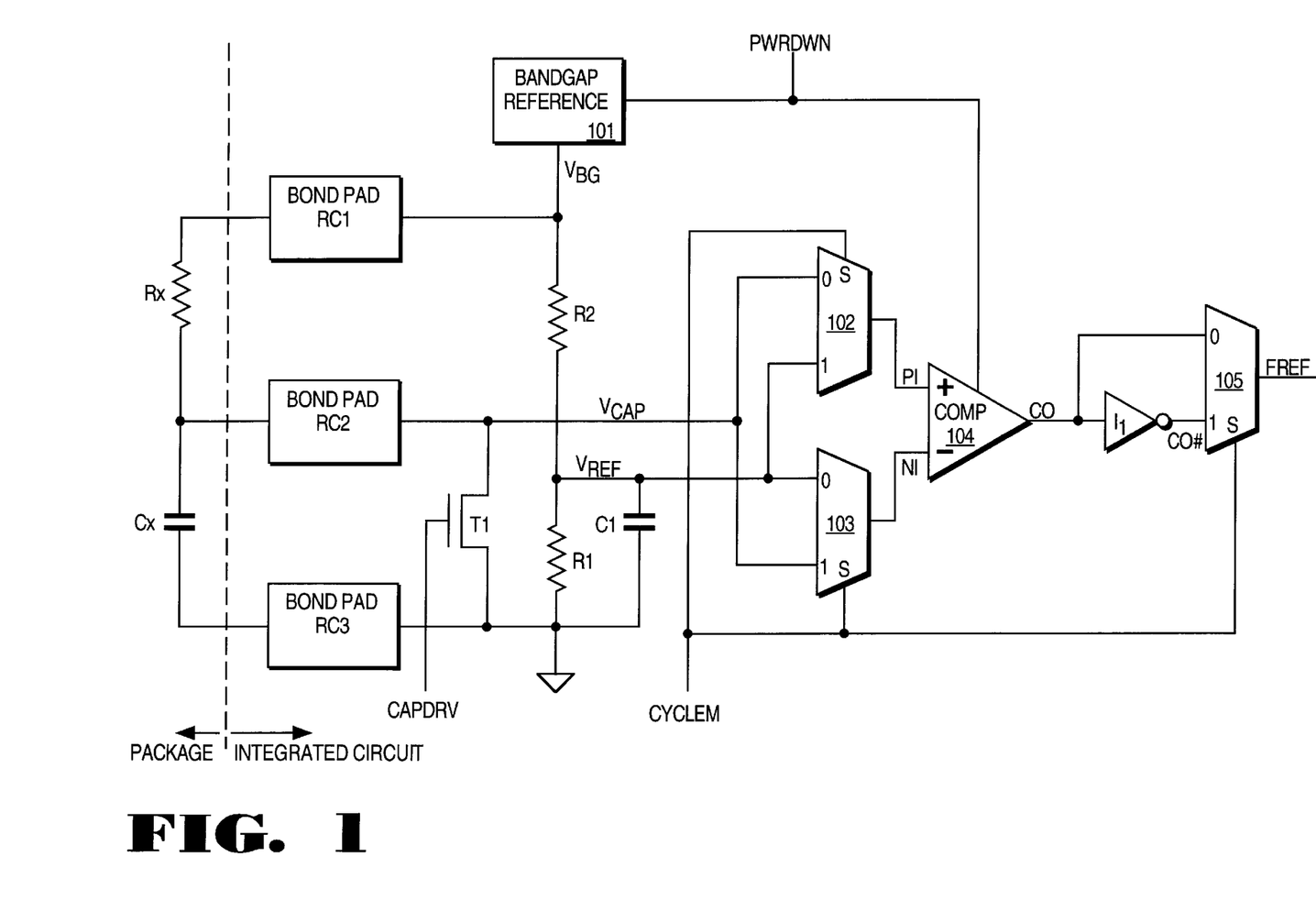
FIG. 1 illustrates one embodiment of an oscillator of the present invention.

FIG. 1 illustrates one embodiment of the oscillator (frequency reference) of the present invention. Referring to FIG. 1, the oscillator comprises a resistor $R_x$ coupled to bondpads RC1 and RC2 and a capacitor $C_x$ coupled to bondpads RC2 and RC3 and the bandgap reference 101 for generating a constant voltage according to well-known methods. The bandgap voltage ($V_{bg}$) of the bandgap reference 101 is coupled to bond pad RC1 to charge capacitor $C_x$ through resistor $R_x$. The ground of the oscillator is coupled to bondpad RC3 and a $V_{cap}$ bus is coupled to bond pad RC2. The $V_{cap}$ voltage on the $V_{cap}$ bus is one of the inputs to the comparator 104.

The $V_{ref}$ voltage on a $V_{ref}$ bus is the other input to the comparator 104. A voltage divider consisting of resistors $R_1$ and $R_2$ and coupled to the output of the bandgap reference 101 is used to generate a predetermined fraction of the bandgap voltage. The $V_{ref}$ voltage establishes the trip point for the comparator 104.

A mux 102 and a mux 103 are used to periodically switch the polarity of the inputs to the comparator 104. The $V_{cap}$ bus is coupled to the 0 input of the mux 102 and the 1 input of the mux 103. The $V_{ref}$ bus is coupled to the 1 input of the mux 102 and the 0 input of the mux 103. A CYCLEM input is coupled to the select (S) input of the mux 102 and the mux 103 to select which input is driven to the PI bus and which input is driven to the NI bus. When the CYCLEM signal is a logic zero, the $V_{cap}$ voltage is driven onto the PI bus and the $V_{ref}$ voltage is driven onto the NI bus. The comparator 104 then asserts the CO signal on the CO bus when the $V_{cap}$ voltage is greater than the $V_{ref}$ voltage and deasserts the CO signal when the $V_{cap}$ voltage is less than the $V_{ref}$ voltage. When the CYCLEM signal is a logic one, the $V_{ref}$ voltage is driven onto the PI bus and the $V_{cap}$ voltage is driven onto the NI bus. The comparator 104 then asserts the CO signal on the CO bus when the $V_{cap}$ voltage is less than the $V_{ref}$ voltage and deasserts the CO signal when the $V_{cap}$ voltage is greater than the $V_{ref}$ voltage. In order to make the output of the timing reference circuit consistent independent of the polarity of the inputs, the CO signal is inverted by inverter $I_1$ to produce the CO# signal on the CO# bus and a mux 105 is used to select CO or CO# depending on the polarity of the inputs. The CO bus is coupled to the 0 input of the mux 105, the CO# bus is coupled to the 1 input of the mux 105, and the CYCLEM bus is coupled to the select input (S) of the mux 105. The mux 105 drives an oscillating signal referred to as the frequency reference (FREF) signal.

Alternatively, an exclusive-or (XOR) gate is coupled to receive the CO signal and the CYCLEM signal and coupled to drive the FREF signal instead of the mux 105 and inverter $I_1$. It will be apparent to one skilled in the art that the XOR gate coupled as described will achieve the same logical functionality as the mux 105 and inverter $I_1$ as described above.

A transistor is coupled to capacitor $C_x$ to discharge it. In the preferred embodiment, the decision logic generates a CAPDRV signal in response to said FREF signal which is used to control a transistor $T_1$. Alternatively, the FREF signal may be directly fed back to control the transistor $T_1$. It will be apparent to one skilled in the art that other mechanisms to discharge the capacitor $C_x$ may be used.

The comparator 104 compares the voltage difference between the PI and NI inputs. When the $V_{cap}$ voltage is driven onto the PI input, when the potential at the PI input exceeds the NI input, the output (CO) of the comparator 104 is asserted. After the CO signal is asserted, a transistor $T_1$ is turned on by asserting the CAPDRV signal to discharge the capacitor $C_x$. This causes the $V_{cap}$ voltage to be pulled to ground very quickly, which causes the FREF signal to be deasserted. This sequence of events is repeated indefinitely, to produce the FREF signal, which has a substantially-constant frequency that is independent of temperature.

In the preferred embodiment, a capacitor $C_1$ is coupled across resistor $R_1$ to filter out high-frequency noise according to well-known methods. High-frequency noise which has a period less than the measurement cycle may cause the trip point of the comparator 104 to vary from one measurement cycle to the next thereby effecting the duration of each measurement cycle. Should high-frequency noise significantly effect the trip point of the comparator 104, the timing reference generator may no longer produce a substantially-constant frequency reference.

In the preferred embodiment, the bandgap reference 101 filters out low-frequency noise according to well-known methods. Low-frequency noise which has a period on the order of a measurement cycle or less may effect the duration of each measurement cycle. Should low-frequency noise significantly effect the trip point of the comparator 104, the timing reference generator may no longer produce a substantially-constant frequency reference. It will be apparent to one skilled in the art that other methods of filtering out low-frequency noise may be used.

In one embodiment, the bandgap reference 101 uses a compensation capacitor. Preferably, the compensation capacitor is constructed using two p-channel metal-oxide field-effect-transistors (MOSFETs) in which the gate of each transistor is coupled to the source, body, and drain of the other transistor. In this configuration, at least one of the capacitors will be reverse biased into the accumulation region. Because of the commonly connected source, body, and drain, the layout of the compensation capacitor may be improved by eliminating the n-well tap and using n-type diffusion regions on both sides of the gate rather than the typical p-type diffusion regions for p-channel transistors. The accumulation region provides the largest capacitance and the best high frequency performance on the capacitance-voltage (CV) curve. This capacitor structure is particularly suited for substantially-constant voltages such as that produced by the bandgap reference 101 because of the voltage dependence of the capacitance.

Low-frequency noise that has a period much longer than a measurement cycle will have little effect on the duration of the measurement cycles. As described above, the timing reference produces a substantially-constant frequency as long as the voltages remain substantially-constant during each period. An example of low-frequency noise that will typically have a period that is much longer than a measurement cycle is noise due to temperature variations.

In the preferred embodiment, a PWRDWN signal is used to disable (power down) devices within the timing reference circuit. For example, the PWRDWN signal may be used to disable the comparator 104 and operational amplifiers, for example. The PWRDWN signal may be asserted in order to reduce power consumption when the speed governor is disabled, for example.

Figure 2:
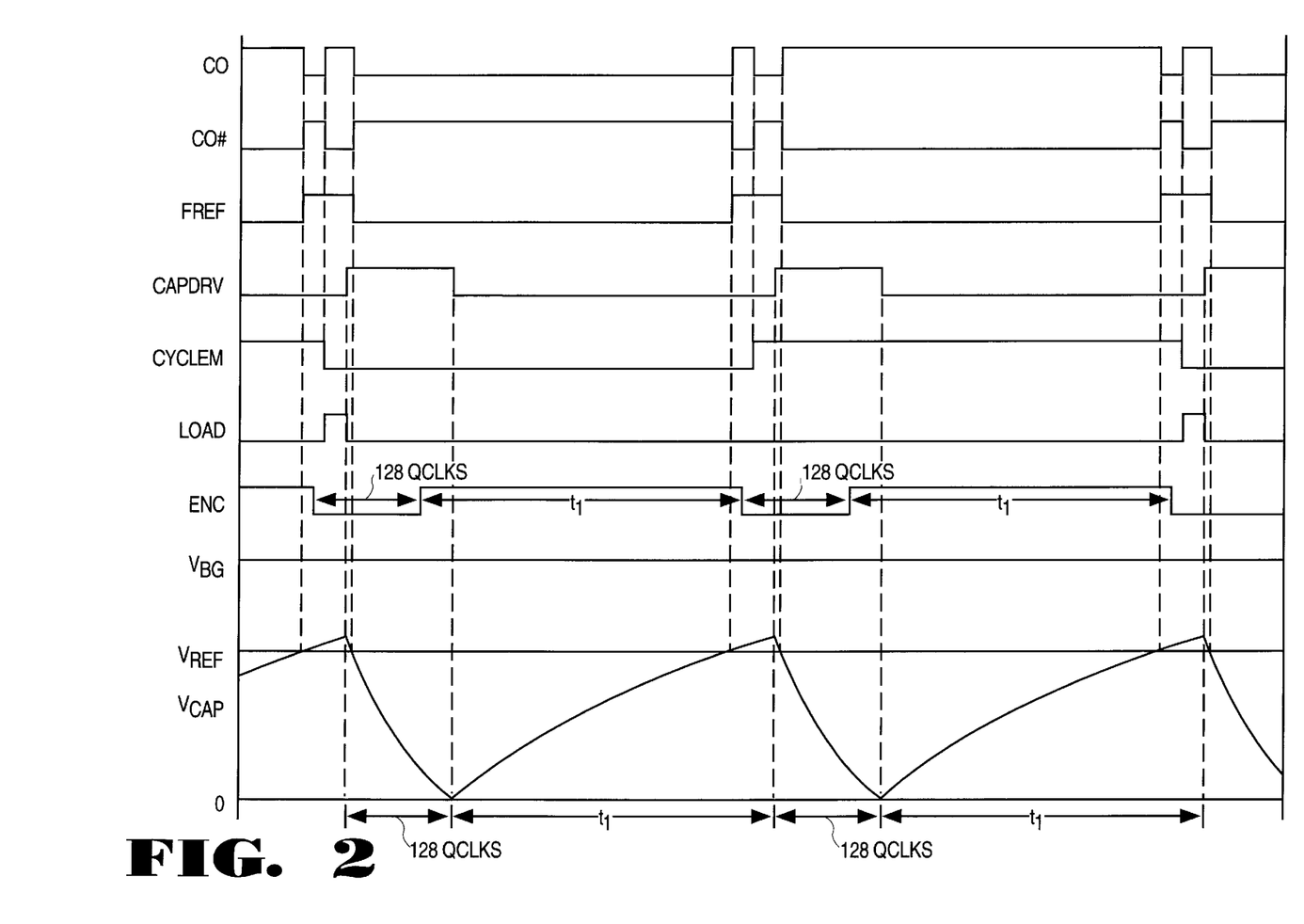
FIG. 2 illustrates waveform diagrams depicting the operation of one embodiment of the present invention.

FIG. 2 illustrates an example of waveforms generated by the oscillator of the present invention when used as a frequency reference in a speed governor. Referring to FIG. 2, the CYCLEM signal alternates between being asserted and deasserted each time the FREF signal is asserted. The alternative CYCLEM signal causes the polarity of the inputs of the comparator 104 to be switched. By having the CYCLEM signal asserted and deasserted for an equal amount of time during each measurement period, the built-in offset biases tend to be canceled and the well-known effects of voltage stress tend to be equalized across the two inputs of the comparator.

In FIG. 2, the CYCLEM signal is initially in the asserted state causing the $V_{ref}$ voltage to be driven to the positive input of the comparator 104 and the $V_{cap}$ voltage to be driven on the negative input of the comparator 104. The comparator 104 asserts the CO signal while the $V_{cap}$ voltage is less than the $V_{ref}$ voltage and deasserts the CO signal when the $V_{cap}$ voltage exceeds the $V_{ref}$ voltage. While the CYCLEM signal is asserted, the mux 105 drives the inverted CO signal, CO#, on the FREF bus.

In response to the assertion of the FREF signal, the CAPDRV signal is asserted for a fixed number of clocks to discharge the capacitor $C_x$. Because of the delay in the response to the assertion of the FREF signal, the voltage ramp of the $V_{cap}$ voltage increases until slightly beyond the voltage reference. Because the clock cycles used to control the duration of the discharge may be dependent on the frequency of the external clock input, a sufficient number of clock cycles should be selected such that the capacitor is discharged at the highest clock frequency.

In one embodiment, The LOAD signal is asserted once every other time the FREF signal is asserted. The counter is loaded with a predetermined count corresponding to a particular cutoff frequency in response to the LOAD signal. The counter counts when an ENC signal is asserted. However, the ENC signal is deasserted in response to the FREF signal for an equal number of clock cycles as used to discharge the capacitor. Otherwise, the ENC signal is asserted. Since the time between each assertion of the FREF signal is the time to charge the capacitor to slightly beyond the reference voltage plus the N clock cycles used to discharge the capacitor, the fact that the counter enabled for the whole period between each measurement period except for N clock cycles means that the counter is enabled for the time to charge the capacitor to slightly beyond the reference voltage. This results in a measurement period that is independent of the frequency of the external clock. In the preferred embodiment, the measurement cycle comprises two cycles of the FREF signal in order to count with CYCLEM asserted during one cycle and deasserted during another cycle. Alternatively, the measurement cycle comprises another even number of cycles of the FREF signal in order to count with an equal number of cycles with CYCLEM asserted and deasserted.

While the CYCLEM signal is in the asserted state, the $V_{ref}$ voltage is driven to the positive input of the comparator 104 and the $V_{cap}$ voltage is driven on the negative input of the comparator 104. The comparator 104 asserts the CO signal while the $V_{cap}$ voltage is less than the $V_{ref}$ voltage and deasserts the CO signal when the $V_{cap}$ voltage exceeds the $V_{ref}$ voltage. The mux 105 drives the inverted CO signal, CO#, on the FREF bus.

While the CYCLEM signal is in the deasserted state, the $V_{ref}$ is driven to the negative input of the comparator 104 and the $V_{cap}$ is driven on the positive input of the comparator 104. The comparator 104 asserts the CO signal while the $V_{cap}$ voltage is greater than the $V_{ref}$ voltage and deasserts the CO signal when the $V_{cap}$ voltage less than the $V_{ref}$ voltage. The mux 105 drives the CO signal on the FREF bus.

Once a stable, digital and temperature independent frequency reference, the FREF signal, is obtained, a decision generator counts the number of external clock cycles that occurs within a measurement cycle.

Figure 3:
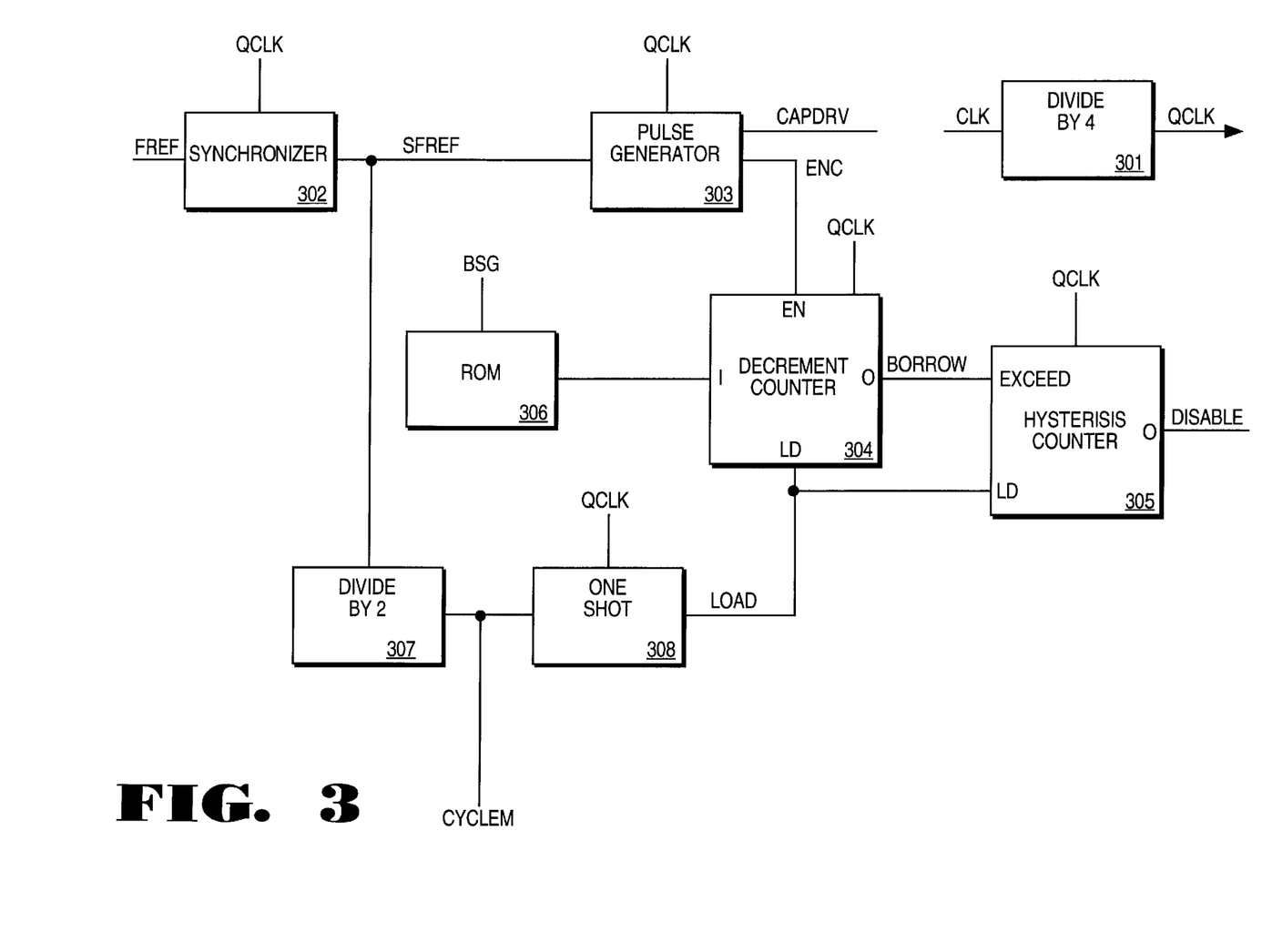
FIG. 3 illustrates one embodiment of the decision logic used to control the oscillator in a speed governor of the present invention.

FIG. 3 illustrates one embodiment of the decision logic used to control the oscillator in a speed governor of the present invention and determine whether the number of external clock cycles in a measurement cycle exceeds a predetermined number that corresponds to a cutoff frequency. The decision logic employs additional circuitry to generate the DISABLE signal when the number of external clock cycles exceeds a predetermined number for a predetermined sequential number of times.

A CLK signal is input to the integrated circuit to clock components within the integrated circuit. The CLK signal governs the rate of data transfer from one flip-flop to the next. The CLK signal is input to a divide-by-4 circuit 301 to produce a divided-by-4 version of the clock, referred to herein as the QCLK signal. The QCLK signal is used by a synchronizer 302, a pulse generator 303, a decrement (down) counter 304, a hysteresis counter 305, and a one-shot 308. By having CLK signal undergo the divide-by-4 operation, the present invention may employ slower components in the decision generator. If the decision generator is configured with faster operating components, then the divide-by-4 operation may not be necessary. By counting the number of QCLK cycles rather than the number of CLK cycles, the predetermined number corresponding to the cutoff frequency is reduced. The smaller predetermined value requires fewer bits in a read-only memory (ROM) 306. It will be apparent to one skilled in the art that the CLK signal may be divided more or less.

The FREF signal is input to the synchronizer 302 to generate a synchronized frequency reference (SFREF) signal which is synchronized with the QCLK signal according to well-known methods. The synchronizer 302 is coupled to receive the QCLK signal and the FREF signal and drives the SFREF signal. The SFREF signal and the QCLK signal are coupled to inputs of the pulse generator 303.

In response to the assertion of the SFREF signal, the pulse generator 303 asserts the CAPDRV signal for a predetermined number of cycles and then deasserts the CAPDRV signal until the next assertion of the SFREF signal. The CAPDRV signal is used to enable transistor $T_1$ to discharge the capacitor $C_x$. When the CAPDRV signal is deasserted, the transistor $T_1$ is disabled and the capacitor begins to be charged. As described above, the discharge of the capacitor causes the FREF signal to be deasserted. The predetermined number of cycles used to discharge the capacitor should be selected such that the transistor $T_1$ is enabled for a sufficient number of clocks to discharge the capacitor $C_x$ at the highest frequency of QCLK. In one embodiment, the CAPDRV signal is asserted for 128 clock cycles for a frequency reference circuit capable of operating with a 75 Megahertz (Mhz) QCLK (300 Mhz CLK) to discharge a capacitor requiring 1.28 microseconds to discharge. It will be apparent to one skilled in the art that these parameters are a matter of design choice.

The SFREF signal is coupled to the input of a divide-by-2 circuit 307 which drives the CYCLEM signal. The CYCLEM signal toggles for each assertion of the SFREF signal. As described above, the CYCLEM signal controls the polarity of the inputs to the comparator 104 in the frequency reference. The CYCLEM signal is also coupled to the input of a one-shot 308 which asserts a LOAD signal in response to the falling edge of the CYCLEM signal. The LOAD signal is used to load the decrement counter 304 with the predetermined value corresponding to the cutoff frequency.

The load signal is only asserted every other FREF signal since the counting is performed over two SFREF cycles—one with CYCLEM asserted and the other with CYCLEM deasserted. Alternatively, the LOAD signal may be asserted in response to the rising edge of the CYCLEM signal.

In one embodiment, a BSG signal is coupled to the input of the ROM 306 to be selectively program individual manufactured units of the same product type or integrated circuit type to different speed grades. The BSG signal used to indicate which of several predetermined values are loaded into the decrement counter 304 when the LOAD signal is asserted. Each of the several predetermined values correspond to the number of QCLK cycles during each pair of SFREF cycles at a particular cutoff frequency. When the number of QCLK cycles in a pair of SFREF cycles exceeds the selected predetermined value (plus one to account for the extra decrement through a count of zero before the BORROW signal is asserted), a timing violation has occurred.

Alternatively, the ROM 306 may be implemented using a simple register, particularly if only one speed grade is available. Also, other forms of programming may be provided to select one of multiple values for the decrement counter 304. It may be feasible to incorporate programming as part of an EPROM or flash EPROM. In other embodiments, the programming may be performed on the fly through, for instance, software running in the computer system in which the integrated circuit is contained.

In response to the SFREF signal, the pulse generator 303 also deasserts the ENC signal for the same predetermined number of clocks that the CAPDRV signal is asserted. Since the time between each SFREF cycle is the sum of the time that the CAPDRV signal is asserted and the time to charge capacitor $C_x$ to the reference voltage, the disabling of the counter for the number of clocks the CAPDRV signal is asserted leaves the counter enabled for the time to charge capacitor $C_x$ to the reference voltage. When the ENC signal is asserted, the decrement counter 304 is enabled and decrements the count each clock cycle of the QCLK. The output of the decrement counter 304 is the sign bit of the count (BORROW signal). Each time the decrement counter 304 is reloaded with the predetermined value, the BORROW signal is deasserted and remains deasserted until the number of QCLK cycles in a pair of SFREF cycles exceeds the predetermined number loaded into the decrement counter 304 plus one. When the count becomes negative, the BORROW signal is asserted. Alternatively, an up counter that increments the count each clock cycle of QCLK may be coupled to a comparator to generate the BORROW signal when the count exceeds the predetermined value.

To ensure correct detection, the hysteresis counter 305 is included in one embodiment. The hysteresis counter 305 increments a counter each time the BORROW signal is asserted before the end of a measurement cycle. The assertion of the LOAD signal corresponds to the end of the measurement cycle since it initiates the decrement counter 304 for the next measurement cycle. If the BORROW signal is deasserted at the end of a measurement cycle, the counter is reset to zero. The DISABLE signal is asserted when a frequency violation occurs for eight consecutive measurement cycles. Thus, the function of the hysteresis counter 305 is to ensure the a real violation is detected, not momentary false ones such as may be due to noise. In alternative embodiments, a hysteresis counter may not be needed. Likewise, the number of consecutive measurement cycles chosen to ensure that a speed violation has occurred is a design choice.

The DISABLE signal is subsequently used to disrupt the normal functionality of the integrated circuit. Note that there are numerous ways well-known to those in the art in which an integrated circuit, such as a microprocessor, may be disabled in response to such a signal. For instance, in response to such a signal, the processor can be forced to access the wrong microcode entry, resulting in a software error, or a control signal can be forced to remain at a logic value that results in erratic behavior.

Figure 4:
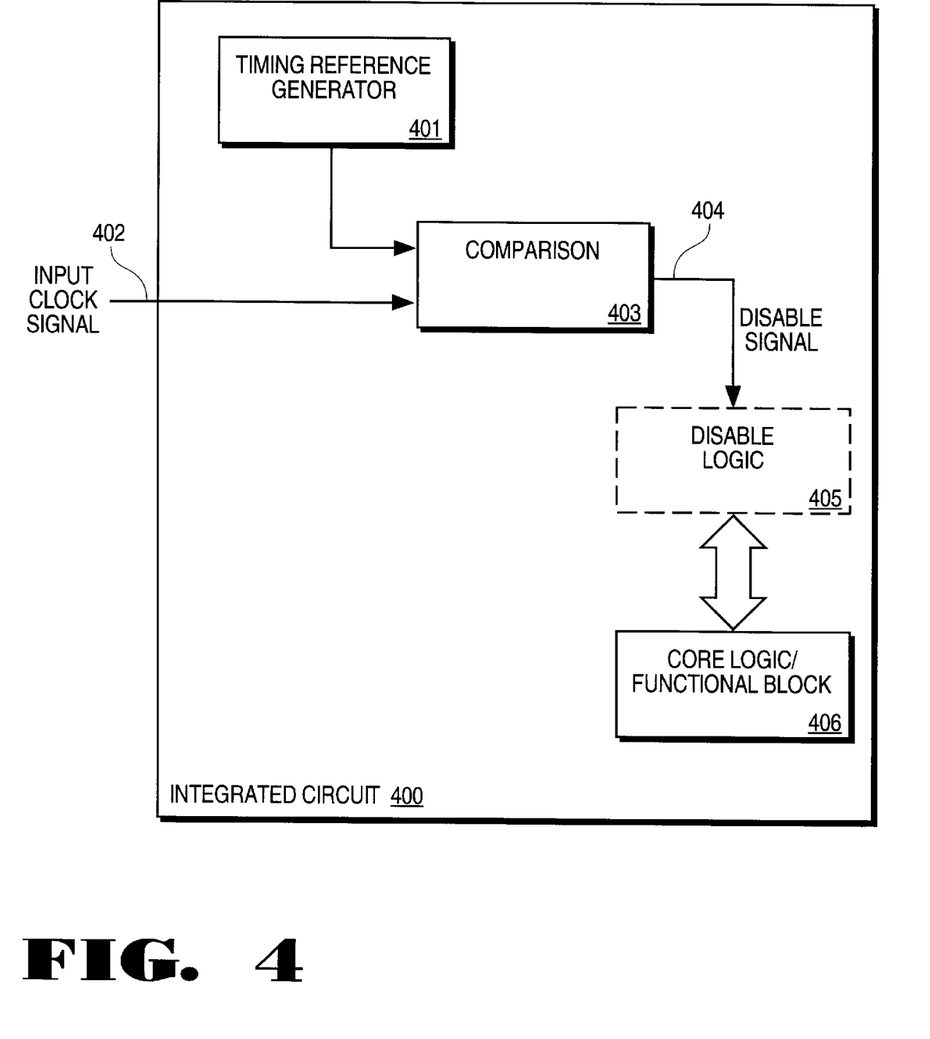
FIG. 4 illustrates one embodiment of an integrated circuit having a speed governor using an oscillator of the present invention.

FIG. 4 is a block diagram of one embodiment of an integrated circuit 400 according to the present invention. Referring to FIG. 4, the integrated circuit 400 comprises a timing reference generator 401, a decision generator 403, and a core logic/function block 406. Optionally, the integrated circuit 400 may include a disable logic 405.

The core logic/function block 406 provides one or more functions. For instance, when the integrated circuit 400 comprises a microprocessor, the functions include fetching, decoding and executing instructions as part of one or more execution pipelines. The decision generator 403 compares an external input clock signal 402 with a timing reference generated by the timing reference generator 401, in a manner described above. Based on the results of the comparison, the decision generator 403 asserts a DISABLE signal 404. Note that the DISABLE signal 404 may be active high (e.g., 1) or active low (e.g., 0).

The DISABLE signal 404 may be received by the core logic/function block 406 directly. In one embodiment, the DISABLE signal 404 may be received by the disable logic 405 which in turn controls the disrupting of the core logic/function block 406. Note that the functionality to disable or disrupt the core logic of a device such as a microprocessor is well-known in the art.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

What is claimed is:

1. An oscillator comprising:

a voltage reference configured to provide a substantially-constant first voltage, wherein said voltage reference is a bandgap reference;

a first capacitor;

a first circuit coupled to receive said substantially-constant first voltage and configured to charge said first capacitor to a second voltage;

a second circuit configured to produce a substantially-constant third voltage;

a comparator coupled to receive said second voltage and said substantially-constant third voltage and configured to produce a first signal depending on a comparison; and a third circuit configured to produce a second signal, said second signal generated in response to said first signal, the first capacitor coupled to be discharged in response to the second signal, wherein said voltage reference comprises a first operational amplifier having a fourth circuit to power down said first operational amplifier in response to a third signal.

2. The oscillator of claim 1 wherein said voltage reference is a zener diode.

3. The oscillator of claim 1 wherein said first circuit comprises a resistor.

4. The oscillator of claim 1 wherein said first circuit comprises a current source.

5. The oscillator of claim 1 wherein said second circuit comprises a voltage divider coupled to receive said substantially-constant first voltage to produce said substantially-constant third voltage.

6. The oscillator of claim 1 wherein said third circuit comprises a transistor having a gate coupled to receive said second signal, said transistor being coupled in parallel with said first capacitor.

7. The oscillator of claim 1 wherein a second capacitor is coupled to receive said substantially-constant third voltage.

8. The oscillator of claim 1, further comprising a fourth circuit to power down said comparator in response to a third signal.

9. An oscillator having an oscillating voltage and a reference voltage, comprising:
    a first circuit coupled to receive said oscillating voltage, said reference voltage, and a first signal, said first circuit providing said oscillating voltage on a first output and said reference voltage on a second output if said first signal is in a first state and providing said reference voltage on said first output and said oscillating voltage on said second output if said first signal is in a second state;
    a comparator having a first input coupled to said first output, a second input coupled to said second output, and a third output having a third signal; and
    a second circuit coupled to said third output for providing said third signal if said first signal is in said first state and providing a complement of said third signal if said first signal is in said second state.

10. The oscillator of claim 9, further comprising a third circuit configured to power down said comparator in response to a second signal.

11. The oscillator of claim 9, wherein
    said first circuit comprises:
        a first mux coupled to receive said oscillating voltage, said reference voltage, and said first signal, said first mux driving said first output; and
        a second mux coupled to receive said oscillating voltage, said reference voltage, and said first signal, said second mux driving said second output; and
    said second circuit comprises:
        an inverter coupled to receive said second signal and drive a complement of said second signal; and
        a third mux coupled to receive said second signal and the complement of said second signal, said third mux driving a fourth output.

12. A speed governor comprising:
    an oscillator comprising:
        a voltage reference configured to provide a substantially-constant first voltage;
        a first capacitor;
        a first circuit coupled to receive said substantially-constant first voltage and configured to charge said first capacitor to a second voltage;
        a second circuit configured to produce a substantially-constant third voltage;
        a comparator coupled to receive said second voltage and said substantially-constant third voltage and configured to produce a first signal having a first plurality of pulses depending on a first comparison result; and
        a third circuit configured to produce a second signal having a second plurality of pulses, the second signal generated in response to the first signal, the first capacitor coupled to be discharged in response to the second signal;
    a counter coupled to receive said first signal and said second signal, said counter configured to count said first plurality of pulses to produce a counter value, said counter value being reset by each of said second plurality of pulses; and
    a fourth circuit coupled to said counter and configured to generate a third signal indicating a second comparison result of said counter value to a predetermined first value.

13. The speed governor of claim 12, wherein said second circuit comprises a voltage divider coupled to receive said substantially-constant first voltage and configured to produce said substantially-constant third voltage.

14. The speed governor of claim 12 wherein said counter is an up counter and said fourth circuit is a second comparator.

15. The speed governor of claim 12 wherein said counter is an down counter, said counter value has a sign bit, and said fourth circuit is a bus coupled to said sign bit.

16. The speed governor of claim 12 further comprising:
    a second counter coupled to receive said third signal, said second counter configured to count the number of times said third signal is asserted, said second counter being reset by each of said second plurality of pulses when said third signal is not asserted, said second counter having a second count value;
    a second comparator configured to output a signal indicating whether said second count value exceeds a second predetermined value.

17. The speed governor of claim 12 further comprising:
    a bus configured to have a first address;
    a memory coupled to said first circuit and said bus, said memory configured to provide said predetermined first value corresponding to said first address.

18. The speed governor of claim 12 further comprising a fifth circuit configured to power down said comparator in response to a fourth signal.

19. The speed governor of claim 12, further comprising a fifth circuit configured to power down one of the group consisting of a pull-up device and a pull-down device in response to a fourth signal.

20. An integrated circuit comprising:
    a speed governor comprising:
        an oscillator comprising:
            a voltage reference configured to provide a substantially-constant first voltage;
            a first capacitor;
            a first circuit coupled to receive said substantially-constant first voltage and configured to charge said first capacitor to a second voltage; and
            a second circuit configured to produce a substantially-constant third voltage;
        a comparator coupled to receive said second voltage and said third substantially-constant voltage and configured to produce a first signal having a first plurality of pulses depending on the comparison result of said second voltage and said third substantially-constant voltage; and
        a third circuit configured to produce a second signal having a second plurality of pulses, the second signal generated in response to the first signal, the first capacitor coupled to be discharged in response to the second signal;

a counter coupled to receive said first signal and said second signal, said counter configured to count said first plurality of pulses to produce a counter value, said counter value being reset by each of said second plurality of pulses; and a fourth circuit coupled to said counter and configured to generate a third signal indicating the comparison result of said counter value to a predetermined first value; and a functional block;

a disable circuit configured configured to selectively disable said functional block in response to said third signal.

21. The integrated circuit of claim 20 wherein said second circuit comprises a voltage divider coupled to receive said substantially-constant first voltage and configured to produce said substantially constant third voltage.

22. The integrated circuit of claim 20 further comprising:

a second counter coupled to receive said third signal, said second counter configured to count the number of times said third signal is asserted, said second counter further configured to be reset when said first signal is asserted and said third signal is not asserted, said second counter having a second count value;

a second comparator configured to output a signal indicating whether said second count value exceeds a second predetermined value.

23. The integrated circuit of claim 20 further comprising:

a bus configured to have a first address;

a memory coupled to said first circuit and said bus, said memory configured to provide said predetermined first value corresponding to said first address.

24. The integrated circuit of claim 20 further comprising a fifth circuit configured to power down said comparator in response to a fourth signal.

25. The integrated circuit of claim 20 further comprising a fifth circuit configured to power down one of the group consisting of a pull-up device and a pull-down device in response to a fourth signal.

26. In a speed governor, a method comprising the steps of:

generating a first signal having a first state and a second state;

receiving a clock signal having a plurality of pulses;

switching a pair of inputs of an operational amplifier in response to each transition between said first state and said second state;

inverting an output signal of the operational amplifier in response to said first signal; and counting said plurality of pulses during a period in which said first signal has been equally in said first state and said second state.

* * * * *